(12) United States Patent
Perino et al.

(10) Patent No.: US 6,657,871 B2
(45) Date of Patent: Dec. 2, 2003

(54) MULTIPLE CHANNEL MODULES AND BUS SYSTEMS USING SAME

(75) Inventors: Donald V. Perino, Los Altos, CA (US); Belgacem Haba, Cupertino, CA (US); Sayeh Khalili, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 10/177,747

(22) Filed: Jun. 20, 2002

(65) Prior Publication Data

US 2003/0007337 A1 Jan. 9, 2003

Related U.S. Application Data

(62) Division of application No. 09/568,424, filed on May 10, 2000.

(51) Int. Cl.[7] .................................................. H05K 7/10
(52) U.S. Cl. ...................... 361/760; 361/777; 361/730; 365/61; 365/51; 257/686
(58) Field of Search ................................. 361/700, 777, 361/730, 748, 790, 735, 301.4, 767, 807; 365/61, 51, 63; 257/686

(56) References Cited

U.S. PATENT DOCUMENTS

| 4,812,135 | A | * | 3/1989 | Smith .......................... 439/493 |
| 5,680,297 | A | * | 10/1997 | Price et al. .................. 361/818 |
| 5,910,885 | A | * | 6/1999 | Gulachenski et al. ........ 361/774 |
| 5,943,573 | A | | 8/1999 | Wen |
| 5,981,870 | A | * | 11/1999 | Barcley et al. ......... 339/17 CF |
| 5,982,654 | A | * | 11/1999 | Corisis ........................ 365/63 |
| 6,005,776 | A | | 12/1999 | Holman et al. |
| 6,137,709 | A | * | 10/2000 | Boaz et al. .................... 365/51 |
| 6,144,576 | A | * | 11/2000 | Leddige et al. ................ 365/63 |
| 6,243,272 | B1 | * | 6/2001 | Zeng et al. .................. 361/760 |
| 6,362,974 | B1 | * | 3/2002 | Lettang ....................... 361/790 |
| 6,381,164 | B1 | * | 4/2002 | Fan et al. ...................... 365/51 |

* cited by examiner

*Primary Examiner*—David Martin
*Assistant Examiner*—Hung Bui
(74) *Attorney, Agent, or Firm*—Pennie & Edmonds LLP

(57) ABSTRACT

Various module structures are disclosed which may be used to implement modules having 1 to N channels. Bus systems may be formed by the interconnection of such modules.

15 Claims, 15 Drawing Sheets

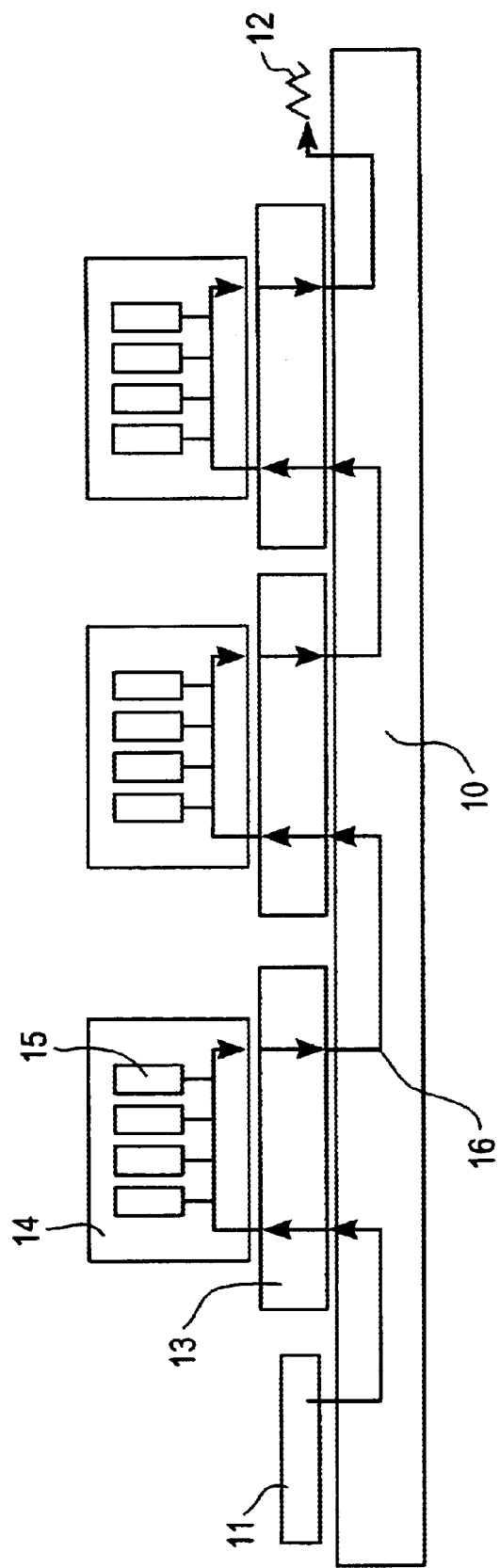
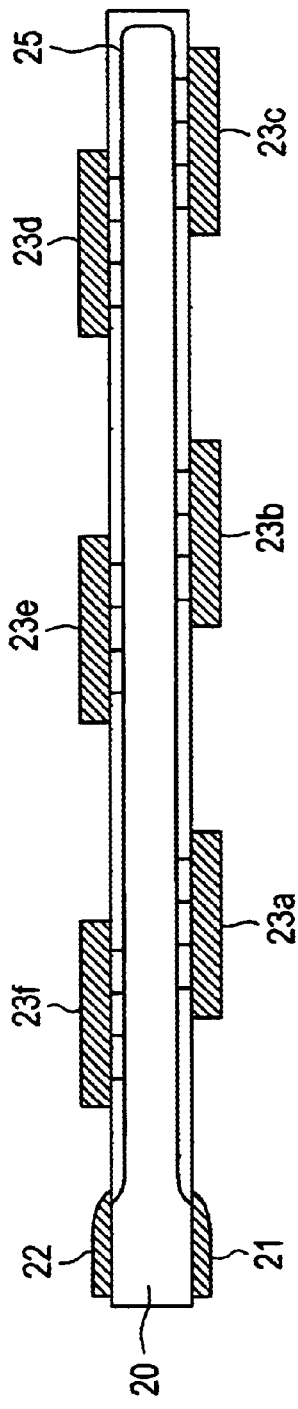
FIG. 1 (PRIOR ART)
FIG. 2

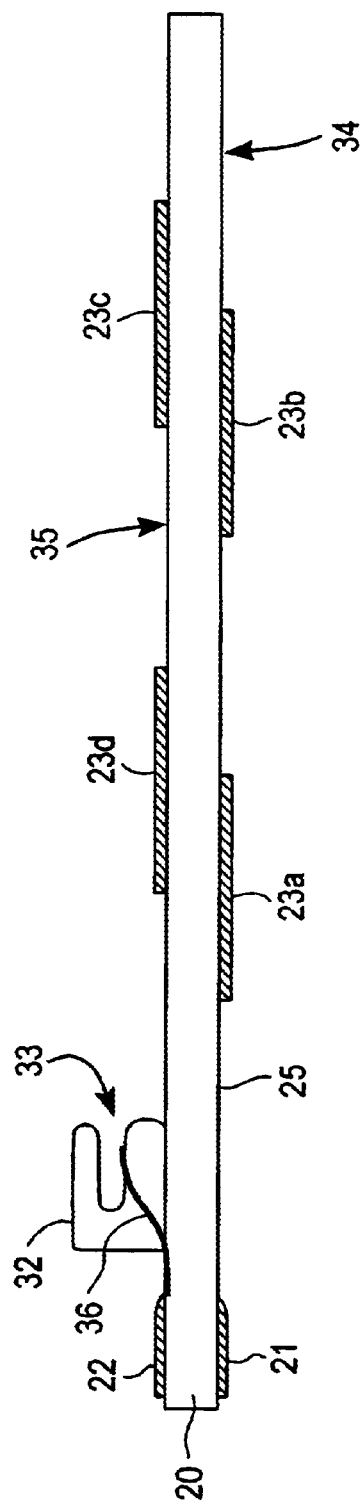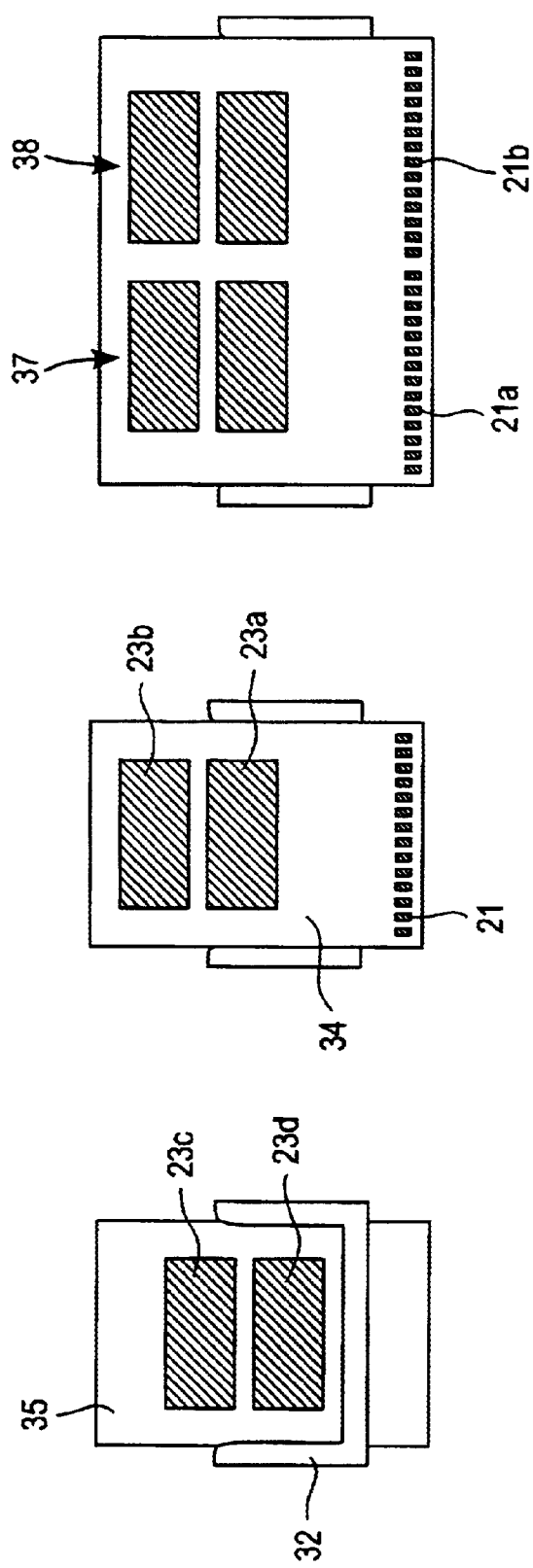
FIG. 3A
FIG. 3B
FIG. 3C
FIG. 3D

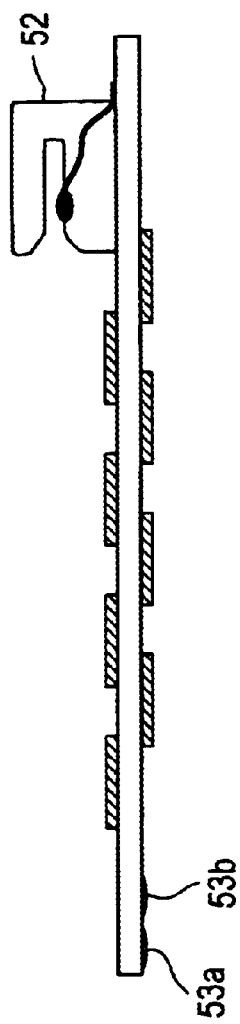
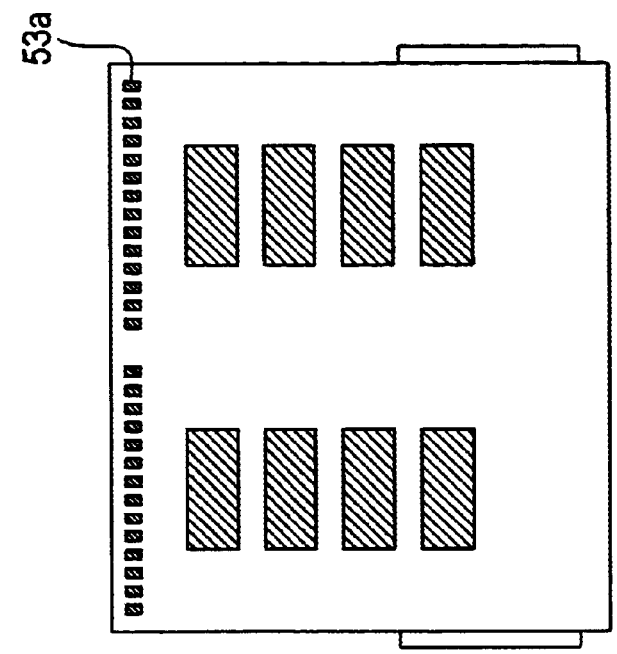
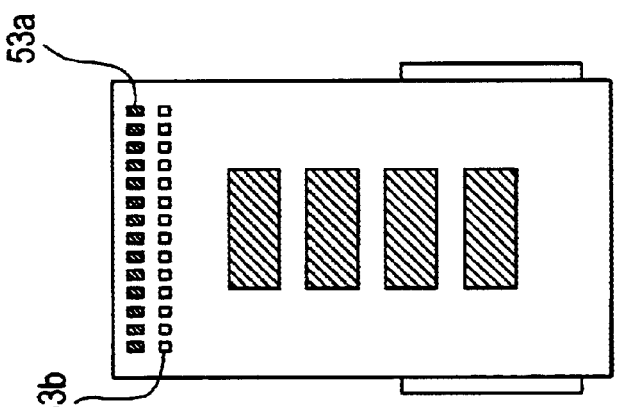
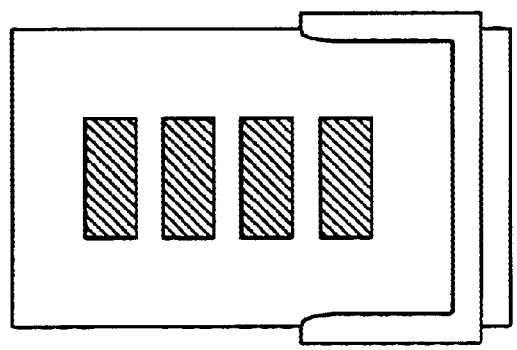
FIG. 5A
FIG. 5B
FIG. 5C
FIG. 5D

MULTIPLE CHANNEL MODULES AND BUS SYSTEMS USING SAME

This is a division of application Ser. No. 09/568,424, filed May 10, 2000.

The present invention is directed to bus systems. More particularly, the present invention is directed to a bus system including one or more modules implementing one or more communications channel(s).

Conventional bus systems are typically implemented in single channel architectures. While conventional bus systems have been implemented using modules, the modules in such systems have merely been arranged in a serial relationship on a motherboard. For example, consider the bus system shown in FIG. 1. This bus system is characterized by a master 11 mounted on a motherboard 10. A number of connectors 13 are also mounted on motherboard 10. Each connector 13 is adapted to receive a module 14 comprising one or more integrated circuits 15. Thus, by means of a connector 13, a module 14 is mechanically mounted and electrically connected within the bus system.

One or more bus(es) 16 forms the communications channel between master 11 and a termination resistor 12. Bus 16 typically comprises a number of signals lines communicating control information, address information, and/or data. The signal lines forming bus 16 traverse the motherboard and/or the modules to electrically connect the integrated circuits 15 to master 11.

There are numerous problems associated with such conventional bus systems. For example, the serial arrangement of the connectors and associated modules creates a relatively lengthy communications channel. Since there are many factors limiting the maximum practical length of a communications channel, channel length should, wherever reasonably possible, be minimized.

Conventional bus systems are also characterized by numerous electrical connection points between the connectors and the bus portions traversing the motherboard, between the modules and the connectors, and between the integrated circuits and the bus portion traversing the modules. Improperly matched electrical connections often produce impedance discontinuities which tend to degrade signal transmission characteristics on the bus. Accordingly, the number of impedance discontinuities associated with the bus connections should be minimized.

Such conventional bus systems present a very static architecture which may not lend itself to the efficient utilization of available space within a larger system. For example, a maximum, pre-set number of connectors is typically provided within the conventional bus system, regardless of the actual number of modules initially contemplated for the bus system. Upgrading the bus system to include additional modules requires that a sufficient number of connectors be provided up to the maximum length (or capacity) of the channel. Typically, empty connectors are filled with dummy modules until they are needed. Absent these spare connectors, upgrading the bus system to include an additional module would require that the motherboard be replaced.

Finally, the static architecture of the conventional bus system provides a "one size fits all" approach to larger systems incorporating the bus system. The serial arrangement of connectors and modules on a motherboard may produce an undesirably large footprint within the larger system. Further, this configuration does not lend itself to irregular or crowded spaces within the larger system.

SUMMARY OF THE INVENTION

The present invention provides module designs and bus system architectures which reduce channel length and minimize bus connection discontinuities. Bus system architectures provided by the present invention may be flexibly configured according to an end user's requirements. Numerous possibilities exist for customized bus system configurations using the modules and interconnection schemes provided by the present invention. Multiple channels may be implemented on a single module and multiple modules may be connected to provide bus systems having relative small vertical profiles and/or horizontal footprints.

In one aspect, the present invention provides a module formed from a printed circuit board (PCB) having primary first and second surfaces and having first and second ends, a plurality of integrated circuits (ICs) populating at least one of the first and second surfaces, a first set of edge fingers disposed at the first end and on the first surface of the PCB, a second set of edge fingers disposed at the first end and on the second surface of the PCB, a folded internal bus extending from the first set of edge fingers, substantially traversing the length of the first surface, folding back at the second end, substantially traversing the length of the second surface and terminating at the second set of edge fingers, and a right-angle connector mounted on either the first or second surface at the first end, and adapted to mechanically receive and electrically connect another module.

In another aspect, the present invention provides a module adapted for use in a bus system and including; a printed circuit board (PCB) having primary first and second surfaces, and having first and second ends, a plurality of integrated circuits (ICs) populating at least one of the first and second surfaces, a set of edge fingers disposed at the first end of the PCB and on either the top or bottom surface of the PCB, a right-angle connector adapted to mechanically receive and electrically connect another module, the right-angle connector being mounted on either the bottom or top surface of the PCB opposite the surface on which the set of edge fingers are disposed and at the second end of the PCB, and an internal bus extending from the set of edge fingers, substantially traversing the length of the module, and terminating at the right-angle connector.

In yet another aspect, the present invention provides a module adapted to be connected within a plurality of bus system modules, the module including a printed circuit board (PCB) having first and second primary surfaces, first and second primary edges, and first and second ends, a plurality of integrated circuits (ICs) populating at least one of the primary first and second surfaces, a first set of edge fingers disposed on the first primary edge between first and second ends and on the first surface of the PCB, a second set of edge fingers disposed on the first primary edge between first and second ends and on the second surface of the PCB, wherein the first and second set of edge fingers are adapted to connect with an electrical connector associated with another module or a motherboard, an internal bus comprising a plurality of signal lines running from at least one of the first and second set of edge fingers to a flex tape connector connected at the second primary edge of the PCB between the first and second ends, and an electrical connector connected to the flex tape.

In still another aspect, the present invention provides a motherboard and a plurality of modules arranged from a first module to a last module, wherein the motherboard comprises a controller and a right-angle connector adapted to mechanically receive and electrically connect the first module, and wherein each one of the plurality of modules comprises a right-angle connector adapted to receive another one of the plurality of modules, such that, once connected via respective right-angle connectors, the motherboard and the plurality of modules are disposed in parallel one to another.

BRIEF DESCRIPTION OF THE DRAWINGS

FIG. 1 illustrates a conventional bus system architecture;

FIG. 2 illustrates a module adapted for use within the present invention;

FIG. 3A is an edge view of one embodiment of a module according to the present invention;

FIGS. 3B and 3C are respectively top and bottom views of a single channel module according to the embodiment shown in FIG. 3A;

FIG. 3D illustrates a two channel module consistent with the embodiment shown in FIG. 3A;

FIG. 5A is an edge view of another embodiment of a module according to the present invention;

FIGS. 5B and 5C are respectively top and bottom views of a single channel module according to the embodiment shown in FIG. 5A;

FIG. 5D illustrates a two channel module consistent with the embodiment shown in FIG. 5A;

DESCRIPTION OF THE INVENTION

Figure 4:
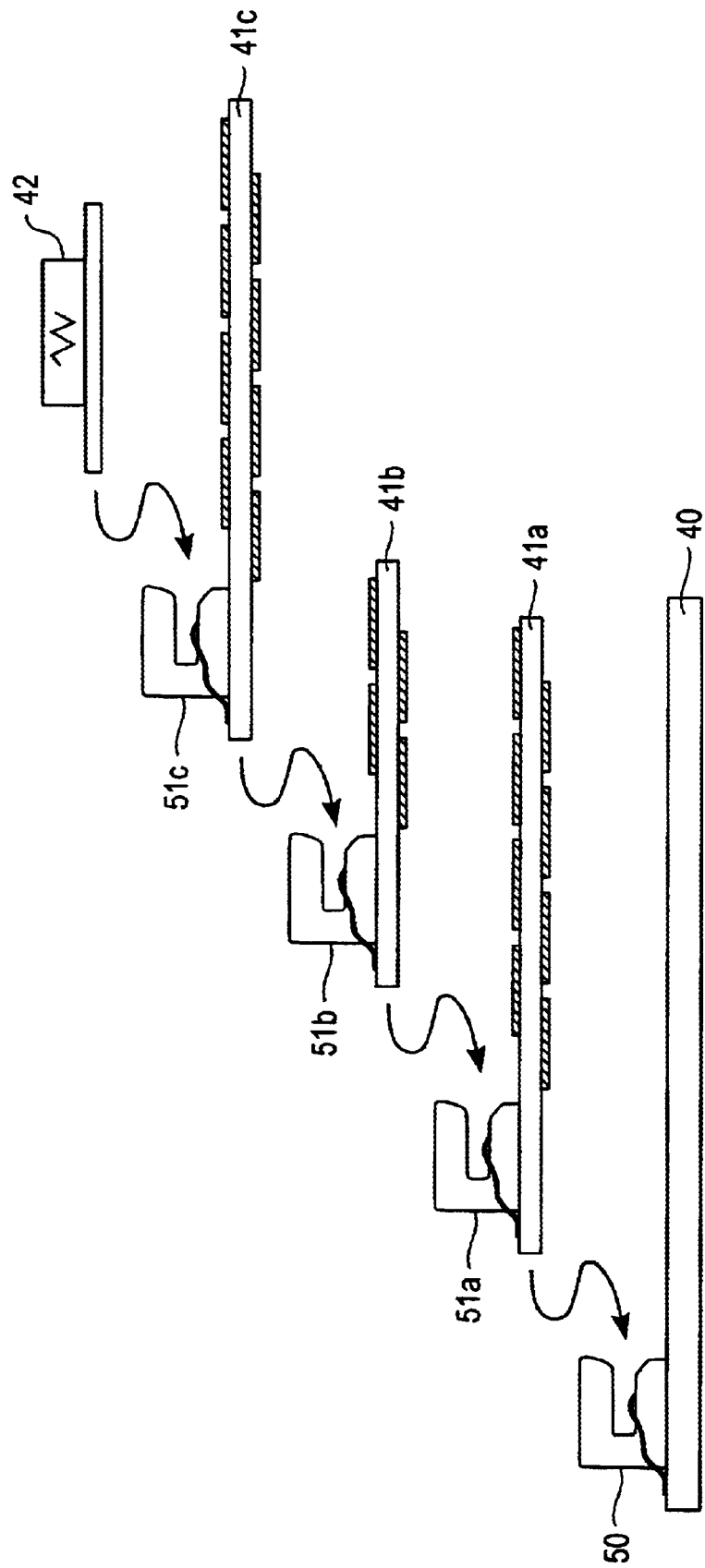
FIG. 4 illustrates a bus system formed by the interconnection of multiple modules according to the embodiment shown in FIGS. 3A through 3D.

The present invention builds upon the subject matter of a related and commonly assigned patent application, Attorney Docket RA-157 filed Apr. 18, 2000. In part, this related application describes the making and use of a novel module. The subject matter of this related application is incorporated herein by reference.

An exemplary embodiment of the module claimed in the related application is shown in FIG. 2. The module comprises a printed circuit board 20 and a plurality of integrated circuits (ICs) 23a–23f mounted thereon. At one end of PCB 20, a first set of edge fingers 21 are disposed on a first primary surface of the PCB and a second set of edge fingers 22 are disposed on an opposing second primary surface of the PCB. Edge fingers are a well known connection mechanism which allow the module to be mechanically secured within a connector (not shown) and electrically connected to a plurality of signal lines provided at the connector.

A bus 25 internal to the module extends from the first set of edge fingers 21, traverses substantially the entire first primary surface of the PCB, folds back at the distant end of the PCB, traverses substantially the entire second primary surface of the PCB, and terminates at the second set of edge fingers 22. Bus 25 typically comprises a plurality of signal lines. The signal lines forming bus 25 may run on top the first and second surfaces of PCB 20. Alternatively, bus 25 may be formed within the body of PCB 20. ICs 23a–23f are respectively connected to this plurality of signal lines.

As described in the related application, the foregoing module may be used in conjunction with a related connector to implement bus systems having improved signal transmission characteristics. Overall channel length and impedance discontinuities related to motherboard connections are reduced. Further, by means of the novel connector and associated module structure described in the related application, bus systems may be implemented in a number of ways. For example, modules may be vertically stacked one above the other, or horizontally racked one next top the other within a single connector.

The present invention allows additional flexibility in the design and implementation of bus systems. Whereas the former invention relies substantially upon the design of the multi-slot connector to flexibly implement bus systems, the present invention relies more on module design.

To this end, consider the module shown in FIG. 3A. Like the module shown in FIG. 2, the module of FIG. 3A comprises a printed circuit board 30 and a plurality of integrated circuits (ICs), here 23a–23d. Of note, the exemplary module of FIG. 2 mounts six (6) ICs connected to bus 25 which is formed within the body of PCB 20, whereas the example shown in FIG. 3A mounts only four (4) ICs connected to bus 25 running on top of the first and second primary surfaces of PCB 30. Within the context of the present invention, any reasonable number of ICs may be mounted on the module. ICs may populate one or both primary surfaces of the module. However, it is presently preferred to populate both primary surfaces of the module since this tends to further reduce channel length.

The module shown in FIG. 3A further comprises a right angle connector 32. Right angle connector 32 is mounted on PCB 30 and comprises a connection slot 33 adapted to receive another module. The "right-angle" nature of the connector nominally provides that slot 33 opens at a right angle to the surface upon which it is mounted. Such an arrangement allows modules to connect one to another in parallel planes. However, one or more modules might be configured with a multi-slot connector as described in the related application.

In the illustrated example of FIG. 3A, bus 25 extends from a first set of edge fingers 21 at a first end of PCB 30, substantially traverses the first primary surface 34, folds back at a second end of PCB 30, substantially traverses the second primary surface 35, and terminates at right angle connector 32. Thus, whereas the module bus portion shown in FIG. 2 extends from first edge fingers 21 to second set of edge fingers 22, the module bus portion shown in FIG. 3 extends from first set of edge fingers 21 to right angle connector 32. ICs 23a–23d respectively connect to the signal lines forming bus 25.

Right angle connector 32 may include one or more signal lines 36 connected back to edge fingers 21, and/or connected to a second set of edge fingers 22. Signal lines 36 might be used, for example, as ground connections.

Modules according to the present invention may implement one or more channels. The term "channel" is broadly defined to define one or more signal lines communicating information between two points. In the following examples, one or more ICs are typically associated with a channel, and the channel communicates information from a master (a controlling device) to a slave (a responding device). However, one of ordinary skill in the art will understand that the ICs in the following examples may be replaced with connectors allowing connection of an auxiliary channel. The ICs in the following examples may be memory devices, receivers, transceivers, logic devices, or other control devices.

FIGS. 3B and 3C show top and bottom views of module illustrated in FIG. 3A.

FIG. 3D illustrates a module similar to the one illustrated in FIGS. 3A–3C. However, the module shown in FIG. 3D implements two channels 37 and 38 on a single module. First channel 37 is associated with a first internal bus running from a first plurality of edge fingers 21a. Second channel 37 is associated with a second internal bus running from a second plurality of edge fingers 21b.

Whether the modules of the present invention implement one or more channels, they may be flexibly configured to form a bus system. FIG. 4 illustrates one such bus system. For clarity, FIG. 4 and subsequent illustrations of modules and bus systems omit labeling readily discernable elements such as the ICs and the PCB which have been described above.

In FIG. 4, a motherboard 40 comprises a first right angle connector 50. The "motherboard" is nominally any printed circuit board having the first right angle connector, but typically comprises a master controlling signal transmissions on the bus. In the example, a first module 41a comprising right angle connector 51a is mechanically secured and electrically connected to motherboard 40 through right angle connector 50. Similarly, right angle connector 51a connects module 41b, and right angle connector 51b connects module 41c.

Such module-to-module connection may continue until a bus system of desired size and configuration is completed. Alternatively, at some point, the channel(s) defined between the master on motherboard 40 and the ICs on the last module will reach its maximum practical length. In either event, when the bus system is complete the signal lines of the bus are preferably terminated in a matched impedance. Signal line termination may be done in a set of termination resistors on the last module, or by means of a special termination module 42 connected to the right angle connector 51c of the last module. By using termination module 42, the other modules need not include termination resistors.

Another embodiment of the modules according to the present invention is shown in FIGS. 5A–5D. The module shown in FIG. 5A does not make use of the folded internal bus structure described above. Rather, one or more sets of finger connectors (53a and 53b) are disposed on either the first or second primary surfaces of the module PCB. Alternatively, the first and second primary surfaces may each include one or more sets of edge fingers. The one or more internal bus(es) associated with these edge fingers substantially traverse the length of the module from one ($1^{st}$) end to another ($2^{nd}$) end connecting related ICs along the way. The one or more internal bus(es) then terminate at right angle connector 52.

FIGS. 5B and 5C show respectively top and bottom views of the module shown in FIG. 5A. FIG. 5D illustrates a two channel version of this module.

Figure 6:
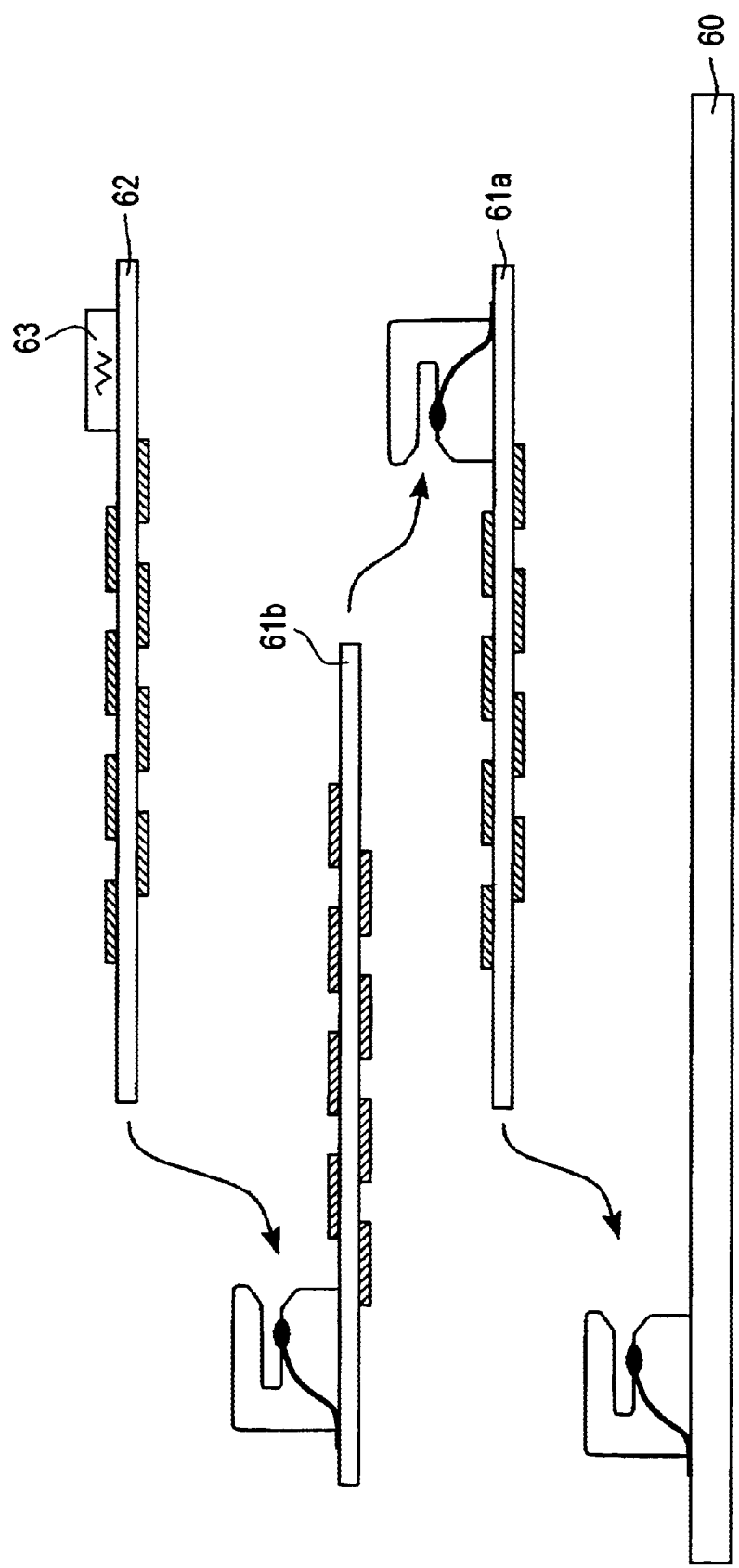
FIG. 6 illustrates a bus system formed by the interconnection of multiple modules according to the embodiment shown in FIGS 5A through 5D.

An exemplary bus system configured with the modules of FIGS. 5A–5D is shown in FIG. 6. When used to configure a horizontally disposed bus system, the bus system of FIG. 6 may provide additional mechanical stability over the bus system illustrated in FIG. 4, since right angle connectors will be placed on both left and right "ends" of the bus system.

In the example shown in FIG. 6, the right angle connector on motherboard 60 receives first module 61a which receives second module 61b. Module 62 is a base module incorporating termination impedance 63.

Figure 7A:
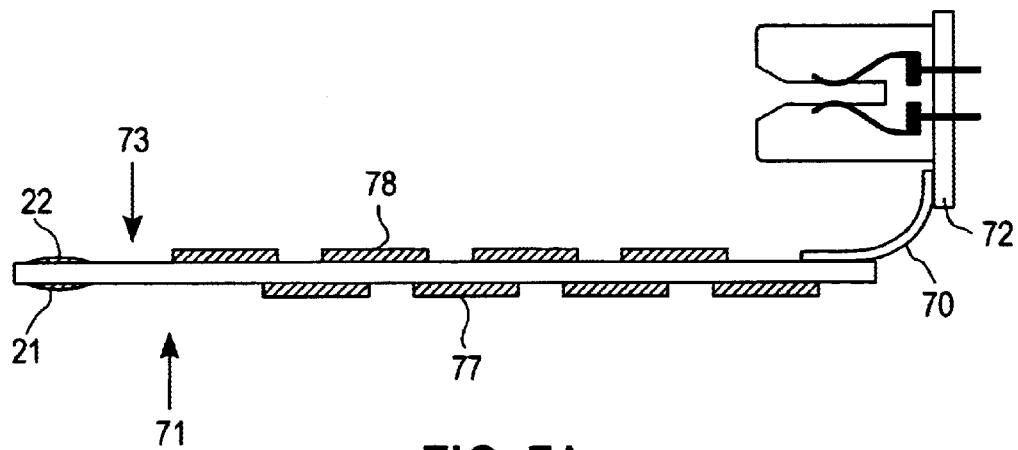
FIG. 7A is an edge view of yet another embodiment of a module according to the present invention.
Figure 7B:
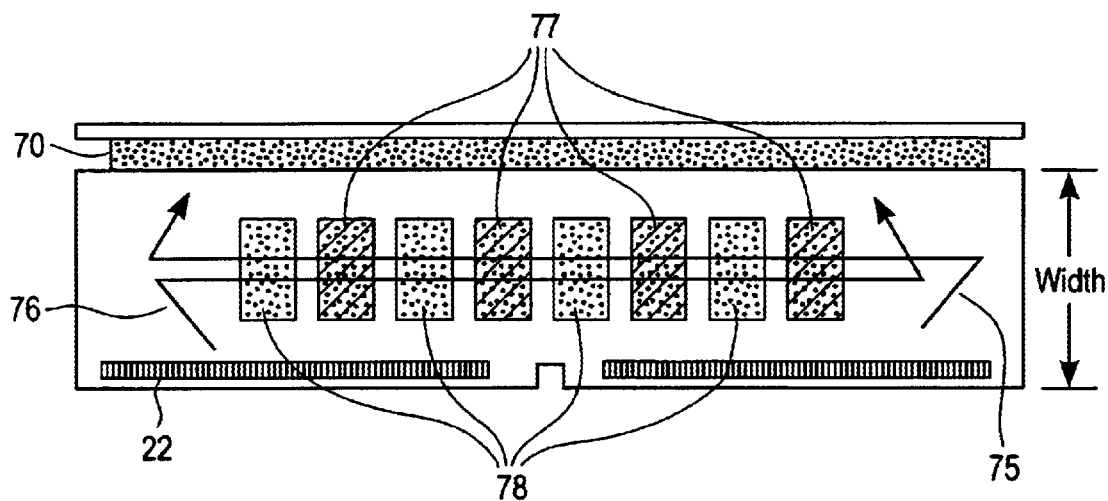
FIG. 7B is a top view of the module of FIG. 7A further illustrating a two channel option to the module's implementation.

Yet another embodiment of the modules according to the present invention is shown in FIGS. 7A and 7B. This module does not use the right angle connectors illustrated in FIGS. 4 through 6 inclusive. Rather, the one or more internal bus(es) terminate at one end of the module in a flex tape connector 70 coupled to an electrical connector 72. Electrical connector 72 may be of conventional implementation. As before, one or more sets of edge fingers (21 and 22) are disposed at the other end of the module on the first primary surface and/or the second primary surface of the PCB. While the embodiment shown in FIG. 7A lends itself to the same channel structures shown in FIGS. 5B–5D, a further refinement of the channel structures is illustrated in FIG. 7B.

In FIG. 7B, a first sub-plurality of ICs 77 populate the first primary surface 71 of the PCB and a second sub-plurality of ICs 78 populate the second primary surface 73 of the PCB. A first internal bus originates at one set of edge fingers 21, laterally traverses the first plurality of ICs 77 and terminates at flex tape connector 70. A second internal bus originates at another set of edge fingers 22, laterally traverses the second plurality of ICs 78 and terminates at flex tape connector 70. In this manner, two channels are implemented which traverse opposing primary surfaces of the PCB in opposite directions. The width of the PCB can therefore be reduced. Compare the width of the module in FIG. 5D.

Figure 8:
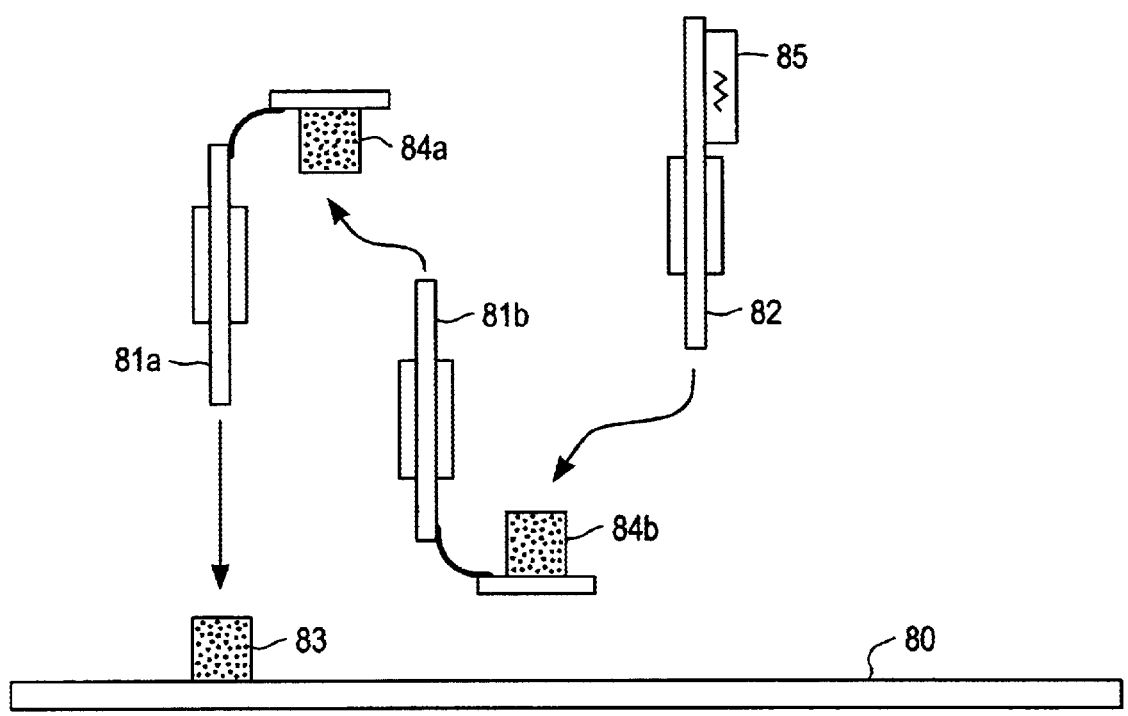
FIG. 8 illustrates a bus system formed by the interconnection of multiple modules according to the embodiment shown in FIGS. 7A and 7B.

An exemplary memory system configured with the module of FIG. 7A is shown in FIG. 8. Within this system motherboard 80 comprises connector 83 which receives first module 81a which in turn receives second module 81b in connector 84a. Connector 84b on second module 81b receives a base module 82 incorporating termination resistor 85. The combination of flex tape and connector allows a bus system comprising multiple modules to be implemented in a variety of forms.

Figure 9A:
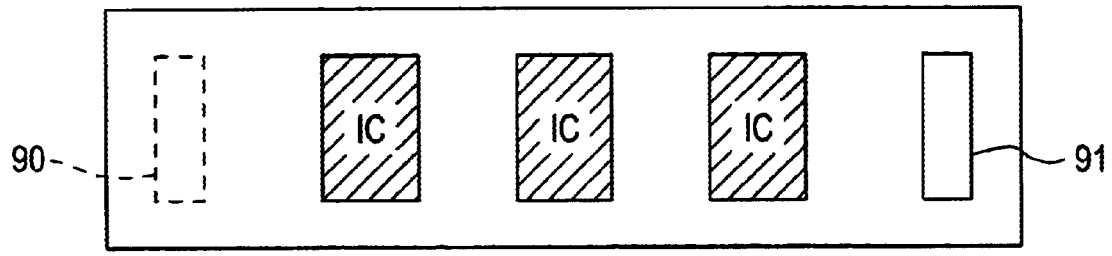
FIGS. 9A and 9B illustrate yet another embodiment of a single channel module according to the present invention.
Figure 9B:
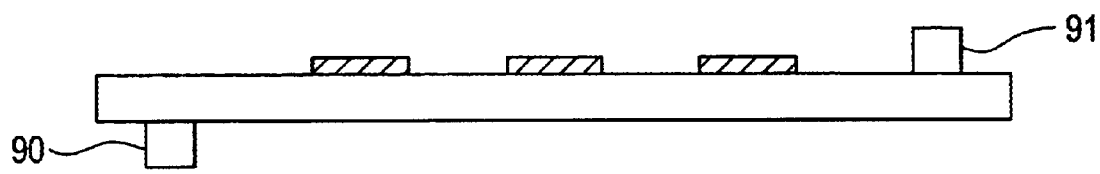

In fact, single channel and multiple channel modules may be implemented in a number forms using conventional electrical connectors. FIGS. 9A and 9B illustrate a single channel module which may be "stacked" or otherwise combined with similar modules to form a bus system having a reduced footprint and a relatively short channel length. Within the module shown in FIGS. 9A and 9B, the internal bus runs from a first connector 90 mounted on a first primary surface of the module, across the length of the module, and terminates in second connector 91 mounted on the second primary surface of the module.

Figure 9C:
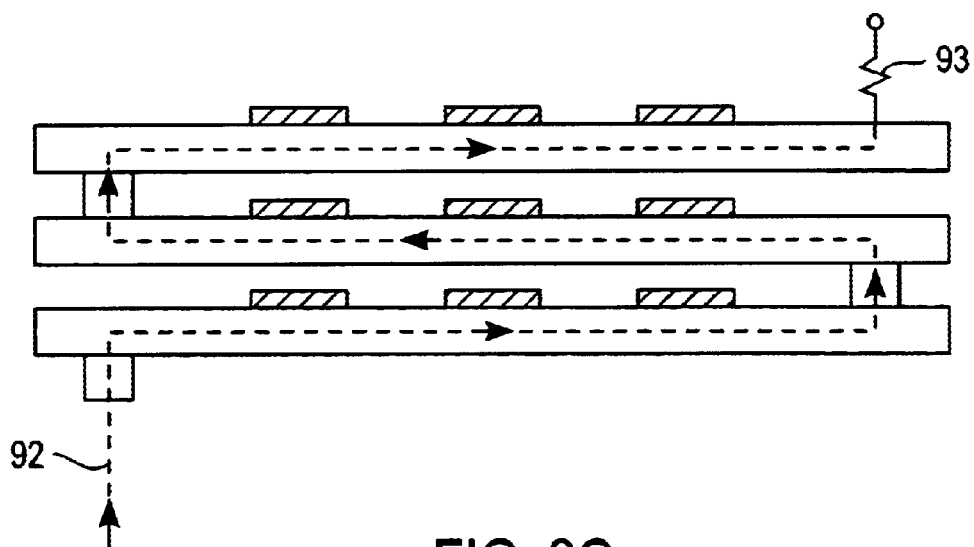
FIG. 9C illustrates a bus system formed by the interconnection of multiple modules according to the embodiment shown in FIGS. 9A and 9B.

FIG. 9C illustrates a bus system implemented with a number of these modules. A channel path 92 is indicated through the bus system which enters the first module at its first connector and thereafter zig-zags though the connected modules as shown until it reaches termination resistor 93. The modules used in the bus system of claim 9C are shown with a single bus traversing ICs populating only one primary surface of each respective PCB. As noted above, a plurality of buses may occupy the channel and one or more of the modules may include ICs on both primary surfaces.

Figure 10A:
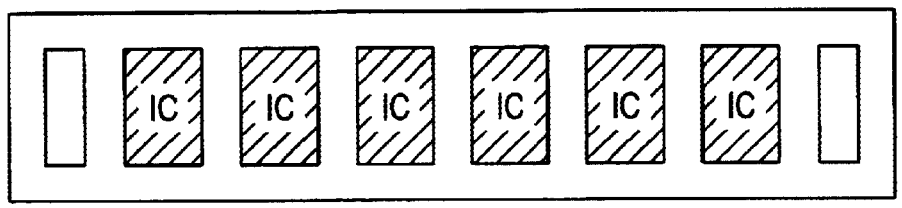
FIGS. 10A and 10B illustrate still another embodiment of a two channel module according to the present invention.
Figure 10B:
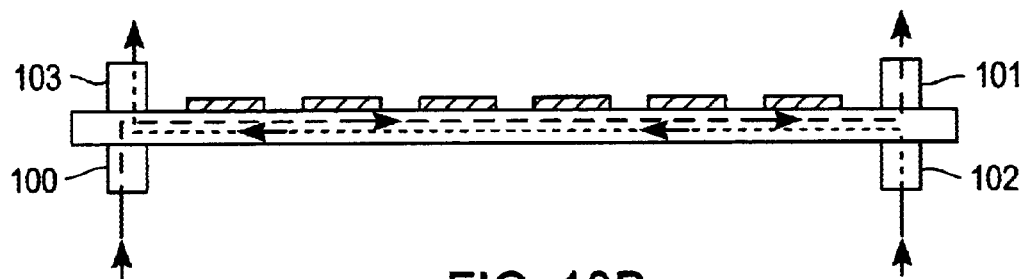

An exemplary two channel module is illustrated in FIGS. 10A and 10B. Here, a first channel path extends from a first connector 100 on the first primary surface of the PCB across the length of the PCB to a second connector 101 on the second primary surface of the PCB. A second channel path extends from a third connector 102 on the first primary surface of the PCB across the length of the PCB to a fourth connector 103 on the second primary surface of the PCB. Thus, first and second channels run counter-directional to one another.

The module of shown in FIGS. 10A and 10B includes a single row of ICs. One of ordinary skill in the art will appreciate that a number of IC rows might be mounted on the module.

Figure 11A:
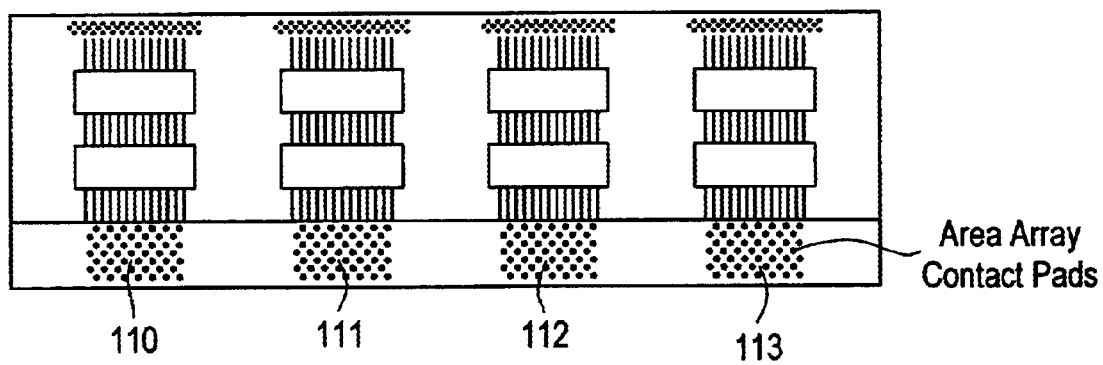
FIGS. 11A and 11B illustrate another embodiment of a four channel module according to the present invention.
Figure 11B:
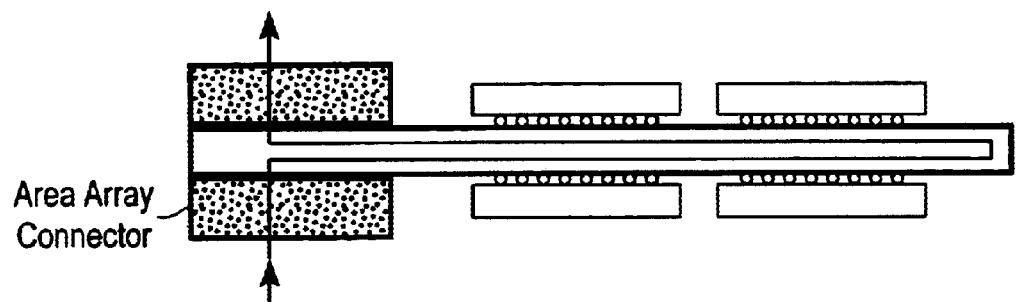
Figure 11C:
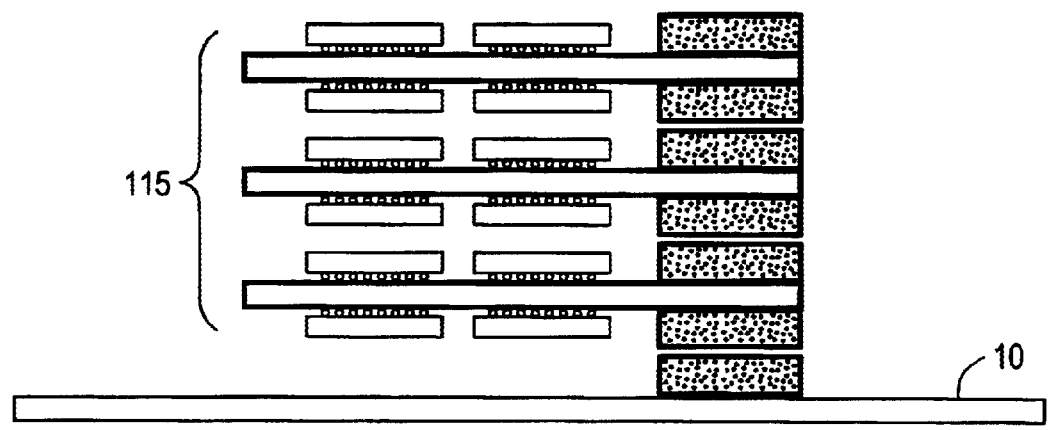
FIGS. 11C and 11D illustrate stacked horizontal and vertical module configurations using the modules shown in FIGS. 11A and 11B.
Figure 11D:
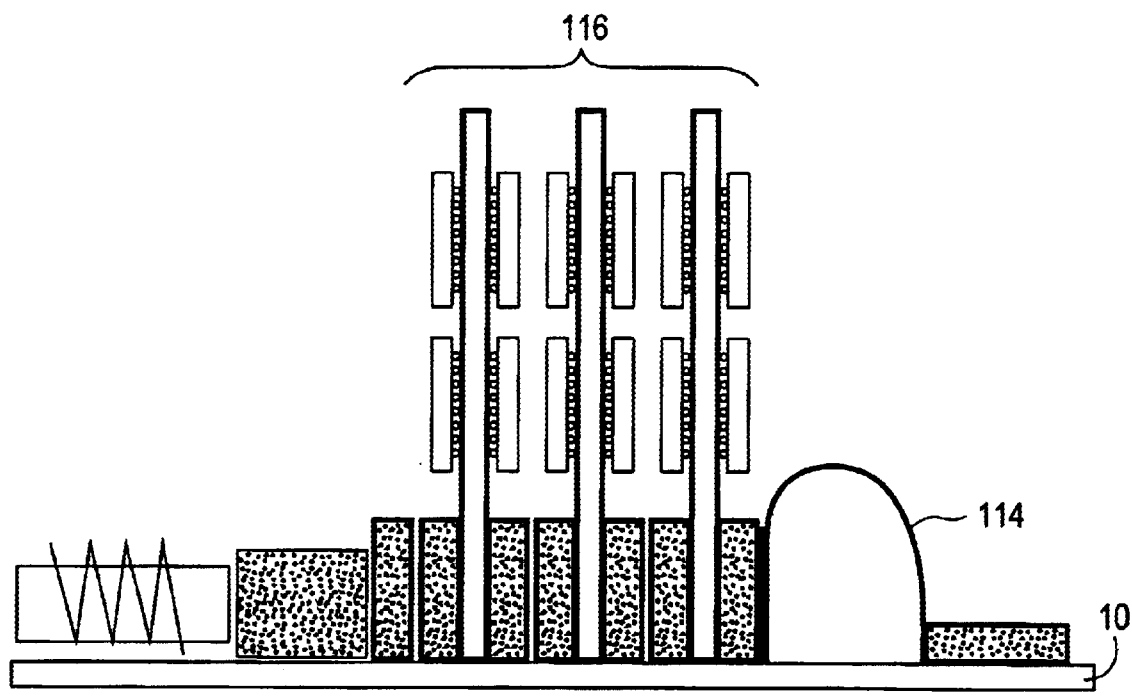

An exemplary four channel module is illustrated in FIGS. 11A and 11B. The module includes four sets of (area array) connectors 111, 112, 113, and 114, each set having a first connector mounted on the first primary surface and a second connector mounted on the second primary surface of the PCB. As shown in FIG. 11B, an internal bus is formed between the first and second connector in each connector set. That is, each bus originates at a first edge of the PCB at a first connector, traverses the width of the module, folds back at a second edge of the PCB, and re-traverses the width of the module until it reaches the second connector in the connector set. The modules shown in FIGS. 11A and 11B may be stacked in horizontal 115 and vertical 116 configurations on motherboard 10 as illustrated in FIGS. 11C and 11D. The vertically stacked configuration 116 of FIG. 11D is connected through a flexible connector 114.

Each one of the foregoing examples makes use of a number of connectors. In addition to providing a connection path between respective internal buses, the structure of the connector may also be used to provide mechanical support for modules which are stacked one above the other, or racked one next to the other in a bus system. While this feature is often desirable in the implementation of certain bus system architectures, the present invention has broader applications.

For example, the present invention may be adapted to take full advantage of conventional ribbon connectors and similar flexible connectors. By means of these connectors, modules forming a bus system need not be stacked or racked in close proximity one to another. Rather, modules may be placed at greater distances one to another and may be mounted within a larger system at odd angles one to another. While separating modules will increase the channel length, there are many applications where reduced channel length will be happily traded away for ease and flexibility of implementation.

Before illustrating the use of flexible connectors, several modules structures will be described. Each of these module structures makes use of "finger connectors." The term "set of edge fingers" has been used above to described a class of electrical connectors characterized by a number of parallel electrical contacts disposed near the edge of a PCB and adapted to "mate" with a corresponding connector slot. Edge fingers are generally pushed into the connector slot to make electrical bus connections and provide mechanical support to the module.

While often located near or at the edge of a PCB, a set of finger connectors need not be located on the edge of the PCB. A set of finger connectors, like a set of edge fingers, typically comprises a set of parallel electrical contacts. In the context of a bus, each electrical contact typically corresponds to a bus signal line. Ribbon connectors and other flexible parallel connectors are well adapted to interconnect such parallel electrical contact structures. However, a ribbon connector may be coupled to a set of finger connectors anywhere on the PCB, not just the edge. Thus, the term finger connector may denote an edge finger, but may also denote a more generic electrical contact.

Figure 12A:
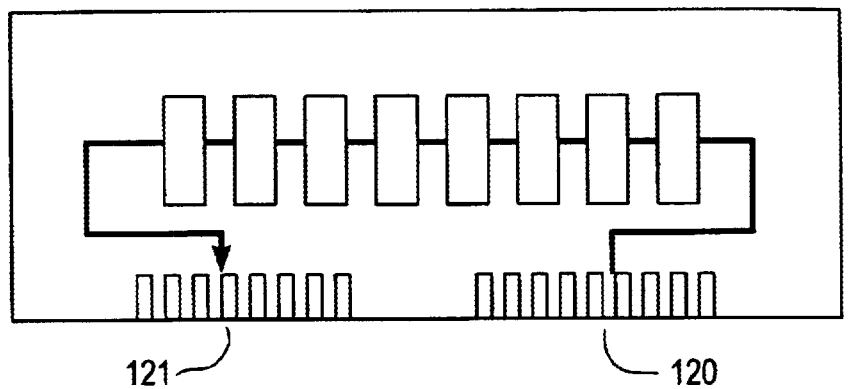
FIG. 12A illustrates yet another one channel embodiment of the present invention.
Figure 12B:
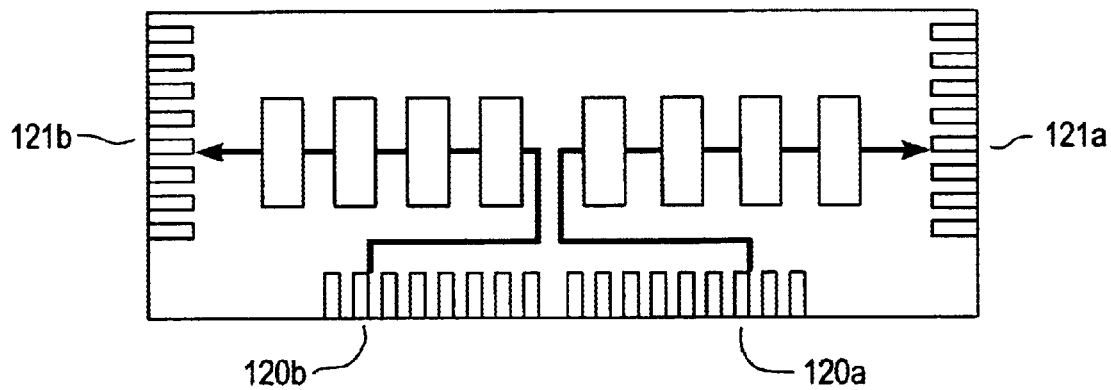
FIG. 12B illustrates yet another two channel embodiment of the present invention.
Figure 12C:
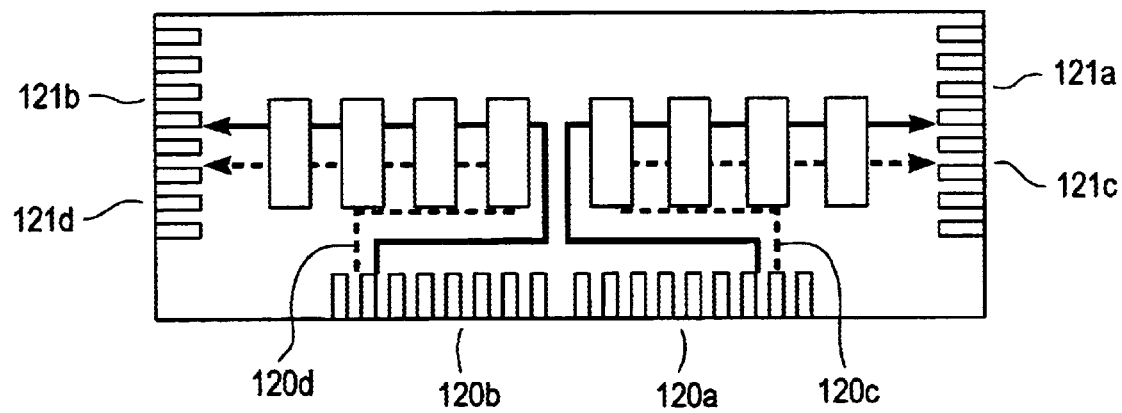
FIG. 12C illustrates yet another four channel embodiment of the present invention.

FIGS. 12A, 12B, and 12C illustrate a single channel module, a two channel module, and a four channel module respectively. The single channel module shown in FIG. 12A comprises a set of input finger connectors 120 and a set of output finger connectors 121. An internal bus substantially traverses the length of the module running from the set of input finger connectors 120 to the set of output finger connectors 121. Along the way, a plurality of ICs are connected to the internal bus. The multi-channel modules shown in FIGS. 12B and 12C includes additional sets of input finger connections and additional sets of output finger connectors. The third and fourth internal buses on the module shown in FIG. 12C are disposed the other primary surface (i.e., the bottom surface in relation to the illustration).

In these examples, the respective sets of input finger connectors (120 and 120a–120d) as well as the output connector 121 in FIG. 12A are edge fingers. Accordingly, the modules may be coupled within a bus system by pushing the edge fingers into a corresponding connector(s). The corresponding connector(s) provide the input signals to the module's internal bus(es). However, the sets of output finger connectors (121a–121d) on the modules shown in FIGS. 12B and 12C are adapted to be connected with one or more ribbon or similar flexible connector(s).

Figure 13B:
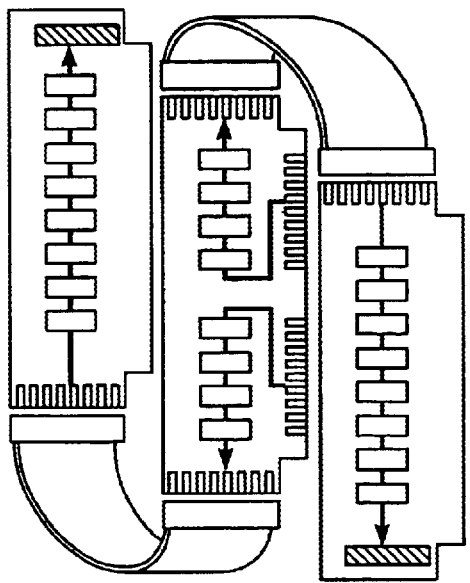
FIGS. 13A, 13B, 13C, and 13D illustrate various two channel bus systems implemented using variations on the modules described in FIGS. 12a, 12B, and 12C.
Figure 13D:
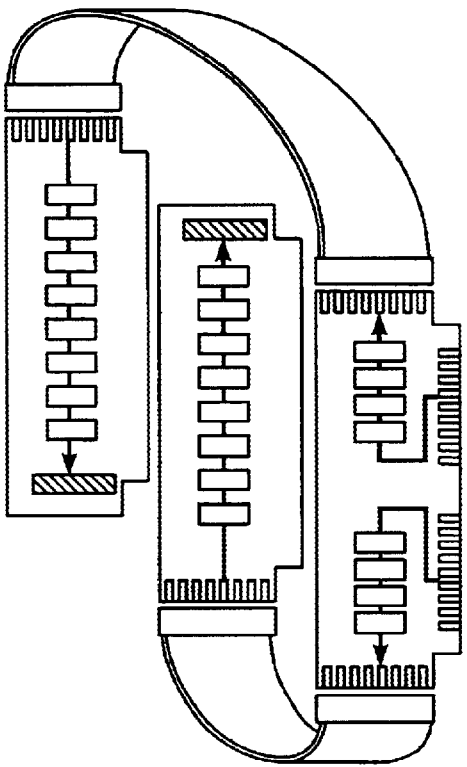
Figure 13A:
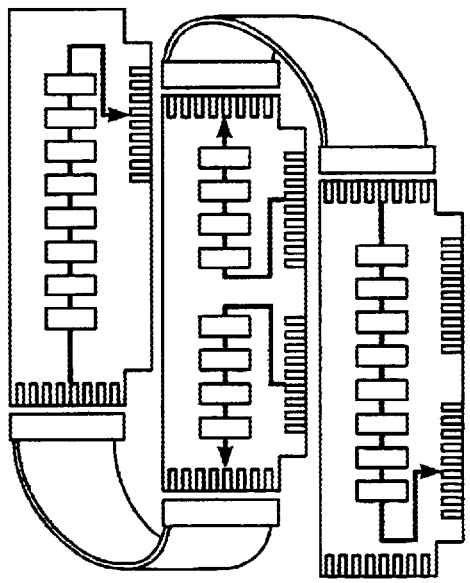
Figure 13C:
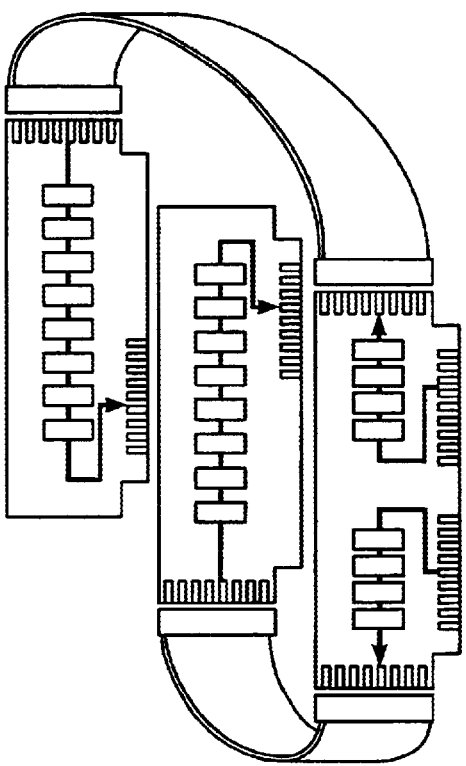

Utilizing one or more of the modules illustrated above, bus systems having various configurations may be implemented using one or more flexible connector(s). Consider the examples shown in FIGS. 13A, 13B, 13C, and 13D. Only two channel bus systems are illustrated, but from these examples one of ordinary skill in the art will readily discern how any reasonable number of "N" channels may be implemented in a bus system. Note that the various channels may be terminated in either a set of output finger connectors (FIGS. 13A and 13C), and/or in an on-module set of termination resistors (FIGS. 13B and 13D).

Figure 14B:
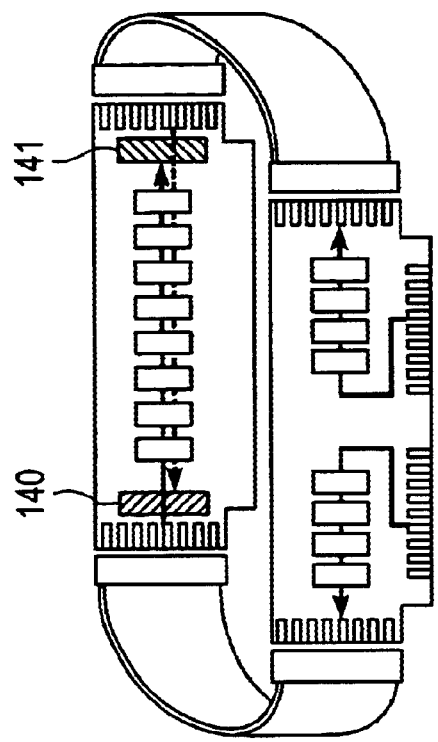
FIGS. 14A, 14B, and 14C further illustrate various two channel bus systems having a number of different termination options; and, FIGS. 15A and 15B illustrate embodiments using a top edge mounted flexible connector.
Figure 14A:
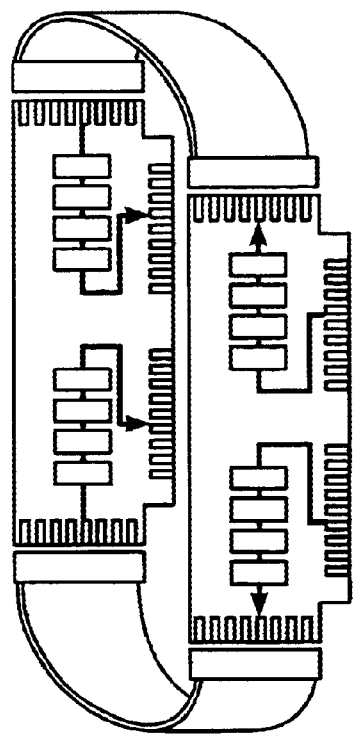
Figure 14C:
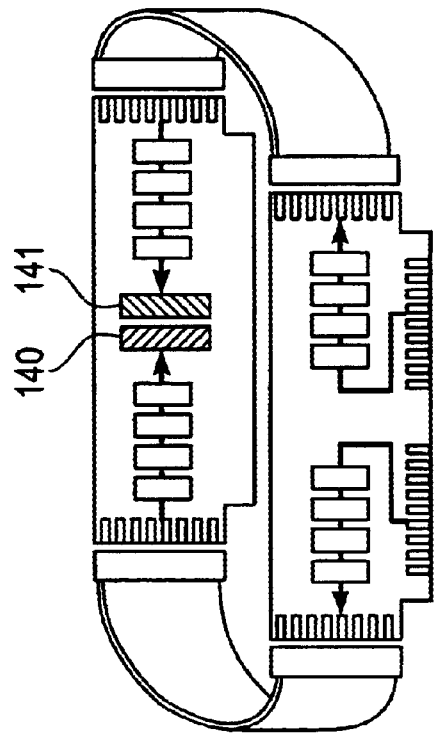

FIGS. 14A, 14B, and 14C illustrate further examples of two channels bus systems having various connection and termination schemes. Like the ICs on these modules, more than one termination element may be mounted on either primary surface. See termination elements 140 and 141 in FIGS. 14B and 14C.

Figure 15A:
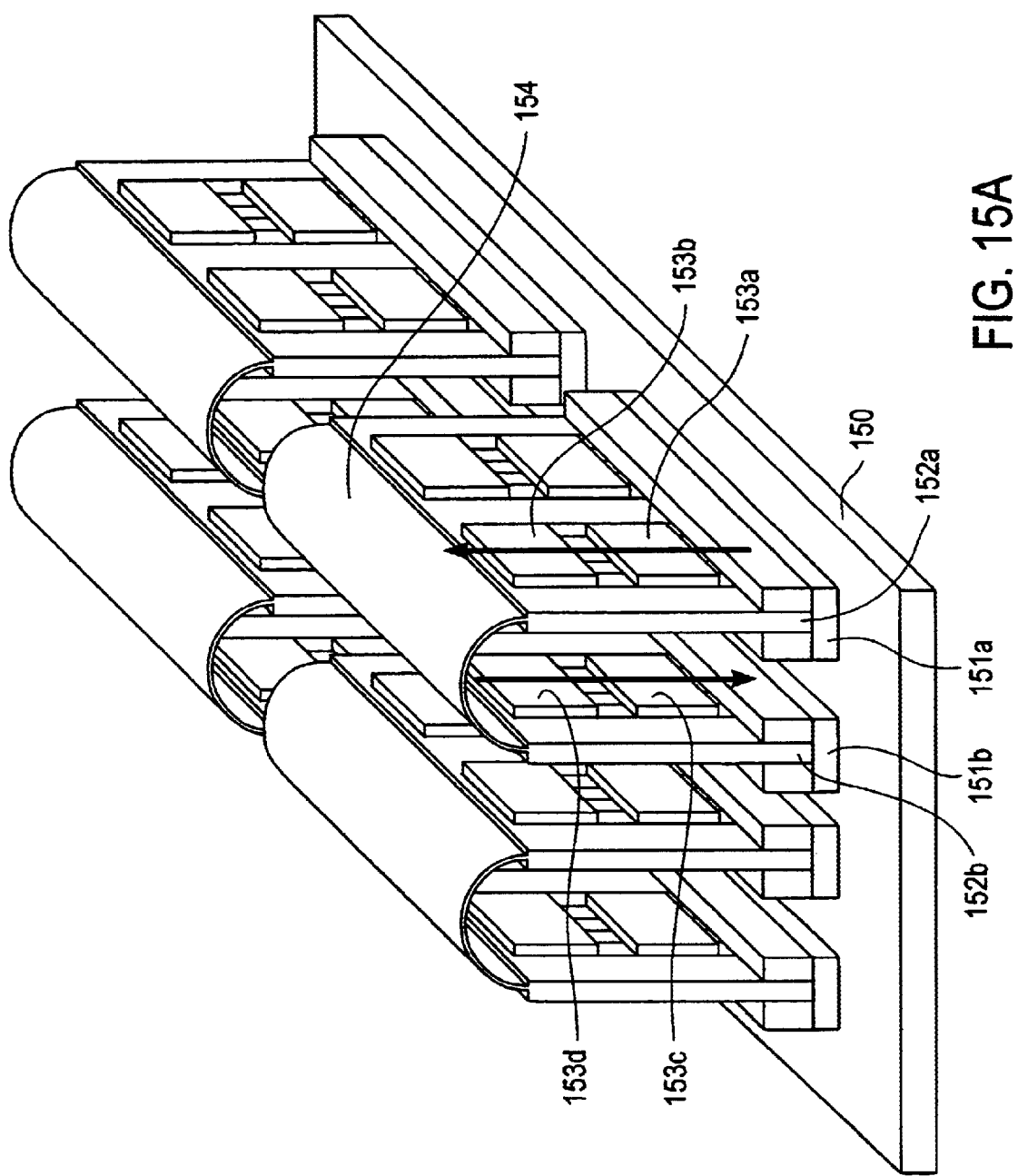
Figure 15B:
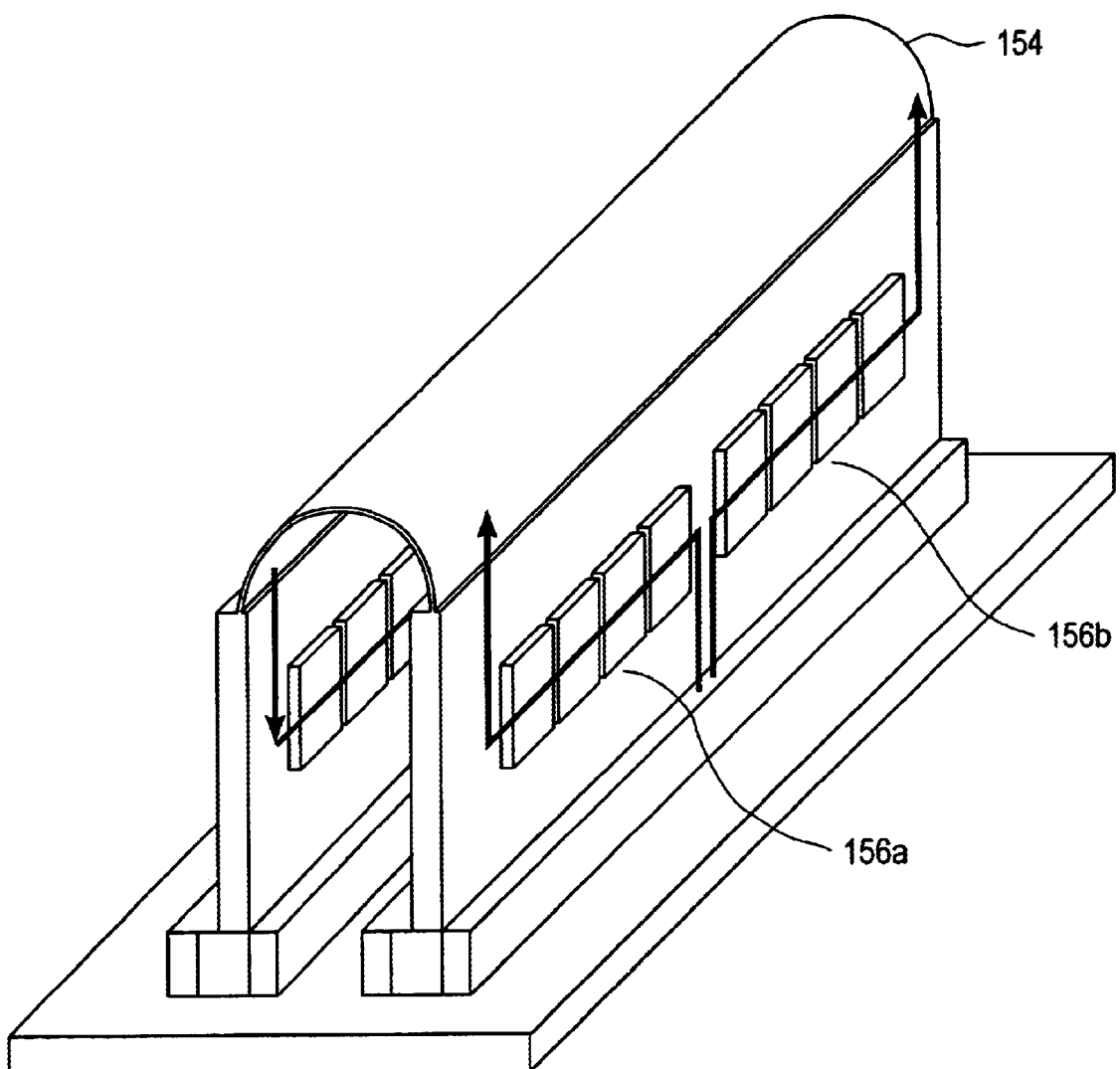

In FIGS. 15A and 15B, a flexible connector 154 is used to connect modules. However, unlike the former examples in which a flexible connector was attached to the modules via a lateral edge, the bus systems shown in FIGS. 15A and 15B use a flexible connector attached via a top edge. In particular, adjacent modules 152a and 152b are respectively mounted on motherboard 159 via connectors 151a and 151b. Module 152a comprises ICs 153a and 153b arranged in a vertical column. Module 152b comprises ICS 153c and 153d which are likewise arranged in a column.

In one further embodiment of the present invention, ICs 153a, 153b, 153c, and 153d are connected in a channel extending from a edge lower fingers on module 152a, through an internal bus portion on module 152a, through flexible connector 154, down through an internal bus portion on module 152b, to be terminated at a lower set of edge fingers on module 152b. Other channels may be similarly implemented.

The bus system shown in FIG. 15B illustrates another way in which a plurality of ICs may be effectively mounted on a module in one or more channels. Here, rather than arranging ICs in vertical columns, the ICs are arranged in rows. A single channel may begin at a centrally located set of edge fingers, make a right turn near the center of the module, extend laterally through the row of ICs, and then make another right turn into flexible connector 154. This path is reversed in the adjacent module. In this manner, first and second pluralities of ICs (156a 156b) may be arranged in rows on each one of the modules and connected as shown.

As illustrated in these examples, the present invention provides modules adapted to be configured with one or more channels. While the foregoing examples have been drawn to multiple channel embodiments, in every case a single channel may be implemented. The modules may be interconnected using various connectors to form bus systems. Such bus systems may be implemented in a variety of configurations and channel definitions. Relative channel lengths may be reduced given a defined set of configuration requirements. Bus interconnections within the system may also be reduced, thereby reducing the potential for impedance mismatches and undesired channel loading.

As with many mechanical systems, the examples given above may be modified in many ways. The use of right angle connectors have been described, as well as the use of conventional connectors including ribbon and other flexible connectors. Other connector types may be used within the present invention. Channel path definition, integrated circuit layout, and internal bus routing on the various modules may also be readily adapted to suit the system designers purpose.

Hence, the foregoing embodiments are merely examples. The present invention is not limited to these examples, but is defined by the attached claims.

What is claimed is:

1. A system comprising:
   a motherboard; and
   a plurality of modules arranged from a first module to a last module;
   wherein the motherboard comprises a right-angle connector adapted to mechanically receive and electrically connect to the first module;
   wherein each module of the plurality of modules comprises:
      a printed circuit board (PCB) having:
         opposing first and second surfaces;
         first and second ends;
         a plurality of integrated circuits (ICs) populating the first surface;
         a first set of edge fingers disposed at the first end and on the first surface of the PCB;
         a second set of edge fingers disposed at the first end and on the second surface of the PCB;
         a folded internal bus extending from the first set of edge fingers, substantially traversing the first surface, folding back at the second end, substantially traversing the second surface and terminating at the second set of edge fingers; and
      an additional right-angle connector mounted on the second surface and adapted to mechanically receive and electrically connect another module of the plurality of modules, such that, once connected via respective right-angle connectors, the plurality of modules are disposed in parallel one to another.

2. The system of claim 1, further comprising a termination module connected to the right-angle connector on the last module.

3. The system of claim 2, wherein a combination of the right-angle connector and the folded internal bus on each module forms a corresponding segment of a system bus.

4. The system of claim 1, further comprising a controller disposed on the motherboard, wherein the controller is coupled to the plurality of ICs of each module of the plurality of modules.

5. The system of claim 4, further comprising a plurality of buses coupled to the controller, wherein the folded internal bus of each module of the plurality of modules forms a portion of a bus of the plurality of buses.

6. A system comprising:
   a motherboard; and
   a plurality of modules arranged from a first module to a last module;
   wherein the motherboard comprises a right-angle connector adapted to mechanically receive and electrically connect to the first module; and
   wherein each module of the plurality of modules comprises:
      a printed circuit board (PCB) having opposing first and second surfaces, and having first and second ends;
      a plurality of integrated circuits (ICs) populating at least one of the first and second surfaces;
      a set of edge fingers disposed at the first end of the PCB and on the first surface of the PCB;
      an additional right-angle connector adapted to mechanically receive and electrically connect to another module, the additional right-angle connector being mounted on the second surface of the PCB and at the second end of the PCB; and
      an internal bus extending from the set of edge fingers, substantially traversing the module, and terminating at the additional right-angle connector.

7. A system comprising a plurality of modules, wherein each one of the modules comprises:
   a opposing first and second surfaces, each surface being adapted to receive one or more integrated circuits (ICs) thereon;
   opposing first and second edges; and
   opposing third and fourth edges,
   the system comprising a first module having:
      first and second sets of edge fingers disposed on the first edge;
      a third set of edge fingers disposed on the third edge; and
      a fourth set of edge fingers disposed on the fourth edge;
   a first internal bus segment electrically connecting the first set of edge fingers and the third set of edge fingers;
   a second internal bus segment electrically connecting the second set of edge fingers and the second fourth set of edge connectors;
   a first plurality of ICs electrically connected to the first internal bus segment; and
   a second plurality of ICs electrically connected to the second internal bus segment.

8. The system of claim 7, further including a second module comprising:
   a fifth set of edge fingers disposed on the third edge of the second module and a sixth set of edge fingers disposed on the fourth edge of the second module;

seventh and eighth sets of edge fingers disposed on the first edge of the second module;

a third internal bus segment electrically connecting the fifth set of edge fingers and the seventh set of edge fingers; and a fourth internal bus segment electrically connecting the sixth set of edge fingers and the eighth set of edge fingers;

a third plurality of ICs electrically connected to the third internal bus segment; and a fourth plurality of ICs electrically connected to the fourth internal bus segment, wherein a first flexible connector connects the third set of edge fingers on the first module with the fifth set of edge fingers on the second module, and second flexible connector connects the fourth set of edge fingers on the first module with the sixth set of edge fingers on the second module.

9. The system of claim 7, further including a second module comprising:

a fifth set of edge fingers disposed on the third edge of the second module and a sixth set of edge fingers disposed on the fourth edge of the second module;

a first termination element disposed proximate the third edge of the second module and a second termination element disposed proximate the fourth edge of the second module;

a third plurality of ICs arranged in one or more rows between the first and second termination elements;

a third internal bus segment electrically connecting at least one of the third plurality of ICs between the fifth set of edge fingers and the second termination element, and a fourth internal bus segment electrically connecting at least one of the third plurality of ICs between the sixth set of edge fingers and the first termination element; and wherein the first flexible connector connects the third set of edge fingers on the first module with the fifth set of fingers on the second module, and the second flexible connector connects the fourth set of edge fingers on the first module with the sixth set of fingers on the second module.

10. The system of claim 7, further including a second module comprising:

a fifth set of edge fingers disposed on the third edge of the second module;

a sixth set of edge fingers disposed on the fourth edge;

first and second termination elements disposed adjacent one to another at a location proximate the center of the second module;

a third plurality of ICs arranged in one or more rows between the fifth set of edge fingers and the first termination element;

a fourth plurality of ICs arranged in one or more rows between the sixth set of edge fingers and the second termination element;

a third internal bus segment electrically connecting the third plurality of ICs between the fifth set of edge fingers and the first termination element; and a fourth internal bus segment electrically connecting the fourth plurality of ICs between the sixth set of edge fingers and the second termination element;

wherein a first flexible connector connects the third set of edge fingers on the first module with the fifth set of fingers on the second module, and the a second flexible connector connects the fourth set of edge fingers on the first module with the sixth set of fingers on the second module.

11. A system comprising a plurality of modules, wherein each one of the modules comprises:

opposing first and second surfaces, each surface being adapted to receive one or more integrated circuits (ICs) thereon;

opposing first and second primary edges; and opposing third and fourth edges, the system comprising:
a central module comprising:
first and second sets of edge fingers disposed on the first edge;
a third set of edge fingers disposed on the third edge and a fourth set of edge fingers disposed on the fourth edge;
a first internal bus segment electrically connecting the the first set of edge fingers and the third set of edge fingers; and
a second internal bus segment electrically connecting the second set of edge fingers and the fourth set of edge fingers;
a first plurality of ICs electrically connected to the first internal bus segment; and
a second plurality of ICs electrically connected to the second internal bus segment.

12. The system of claim 11, further comprising at least one secondary module, comprising:

a fifth set of edge fingers disposed on the third edge of the second module, the fifth set of edge fingers being connected to the third set of edge fingers via a flexible connector;

a third plurality of ICs disposed on the first surface of the second module; and a third internal bus segment connecting the third plurality of ICs between the fifth set of edge fingers and one of a termination element and a sixth set of edge fingers disposed on the first edge of the second module.

13. A module comprising:

a printed circuit board (PCB) having:
opposing first and second surfaces;
opposing first and second edges, wherein the bottom first edge is adapted to be mechanically secured and electrically connected within a connector;

a plurality of integrated circuits (ICs) arranged on at least one of the first and second surfaces;

a flexible connector connected to the second edge of the PCB; and, an internal bus extending from a first set of edge fingers located on the first edge of the PCB and traversing the arrangement of the plurality of ICs to the flexible connector.

14. The module of claim 13, wherein the plurality of ICs are arranged in one or more columns, and the internal bus extends from the first set of edge fingers to the flexible connector.

15. The module of claim 13, wherein the plurality of ICs are arranged in one or more rows, and the internal bus first extends from the first set of edge fingers to the one or more rows of ICs, then through the one or more rows of ICs, and then to the flexible connector.

* * * * *

UNITED STATES PATENT AND TRADEMARK OFFICE
CERTIFICATE OF CORRECTION

PATENT NO. : 6,657,871 B2
DATED : December 2, 2003
INVENTOR(S) : Perino et al.

It is certified that error appears in the above-identified patent and that said Letters Patent is hereby corrected as shown below:

Column 12,
Line 1, delete the second occurrence of "the";
Line 10, delete "primary"; and
Line 47, delete "bottom".

Signed and Sealed this

Third Day of August, 2004

JON W. DUDAS
*Acting Director of the United States Patent and Trademark Office*